(12) United States Patent
Hashimoto

(10) Patent No.: US 8,497,432 B2
(45) Date of Patent: Jul. 30, 2013

(54) ELECTRONIC COMPONENT MOUNTING STRUCTURE

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 406 days.

(21) Appl. No.: 12/561,526

(22) Filed: Sep. 17, 2009

(65) Prior Publication Data

US 2010/0071946 A1 Mar. 25, 2010

(30) Foreign Application Priority Data

Sep. 24, 2008 (JP) ................................ 2008-244040

(51) Int. Cl.
*H05K 1/16* (2006.01)

(52) U.S. Cl.
USPC ........................................................ 174/260

(58) Field of Classification Search
USPC ... 174/260; 257/690, 737, 738, 772; 361/726, 361/760, 770–774, 790, 792, 794
See application file for complete search history.

(56) References Cited

U.S. PATENT DOCUMENTS

| | | | | |
|---|---|---|---|---|
| 7,057,283 B2 * | 6/2006 | Inoue et al. | ................... | 257/737 |
| 7,276,792 B2 | 10/2007 | Tanaka et al. | | |
| 7,943,863 B2 * | 5/2011 | Nakamura | ................... | 174/264 |
| 2007/0007651 A1 | 1/2007 | Hashimoto | | |
| 2007/0057370 A1 | 3/2007 | Hashimoto | | |
| 2007/0057371 A1 | 3/2007 | Hashimoto | | |
| 2007/0063345 A1 | 3/2007 | Hashimoto | | |
| 2007/0108607 A1 | 5/2007 | Hashimoto | | |

FOREIGN PATENT DOCUMENTS

| | | |
|---|---|---|
| JP | 2002-261407 | 9/2002 |
| JP | 2005-235829 | 9/2005 |
| JP | 2005-353983 | 12/2005 |
| JP | 2007-081039 | 3/2007 |
| JP | 2007-081042 | 3/2007 |
| JP | 2007-129156 | 5/2007 |
| JP | 04-224717 | 12/2008 |
| JP | 04-235835 | 12/2008 |

* cited by examiner

*Primary Examiner* — Jeremy Norris
*Assistant Examiner* — Tremesha S Willis
(74) *Attorney, Agent, or Firm* — Harness, Dickey & Pierce, P.L.C.

(57) ABSTRACT

An electronic component mounting structure includes a substrate having a terminal, an electronic component having an active face, an electrode that is formed on the active face of the electronic component, a base resin that is formed on the active face, a first opening that is formed at the base resin to expose the electrode, and a conductive film that covers a part of a top surface of the base resin and that is electrically connected to the electrode via the first opening. Because the base resin is bonded to the substrate, the bonding strength between the conductive film located on the top surface of the base resin and the terminal of the substrate is increased. Therefore, the reliability of electrical connection between the conductive film and the terminal is improved.

9 Claims, 6 Drawing Sheets

ELECTRONIC COMPONENT MOUNTING STRUCTURE

BACKGROUND

1. Technical Field

The present invention relates to an electronic component mounting structure.

2. Related Art

Technologies for mounting an electronic component, such as a semiconductor IC, on a substrate have been used in the process of manufacturing circuit substrates or liquid crystal displays to be mounted on various electronic apparatuses. For example, a liquid crystal-driving IC chip for driving a liquid crystal panel is mounted on a liquid crystal display. Such a liquid crystal-driving IC chip may be directly mounted on a glass substrate to be included in a liquid crystal panel. Also, such a liquid crystal-driving IC chip may be mounted on a flexible substrate (FPC) to be mounted on a liquid crystal panel. The former mounting structure is called a COG (chip on glass) structure, and the latter is called a COF (chip on FPC) structure. In addition to these mounting structures, a COB (chip on board) structure where an IC chip is mounted on a glass-epoxy substrate or the like is also known.

On a substrate used in such a mounting structure, a land (terminal) connected to a wiring pattern is formed, while on an electronic component, a bump electrode for obtaining electrical connection is formed. By mounting the electronic component on the substrate in a state where the bump electrode is connected to the land, an electronic component mounting structure is formed.

Incidentally, in the above-mentioned mounting structure, it is desirable that the electronic component be connected onto the substrate more firmly and reliably. In particular, if the substrate and electronic component include multiple lands and multiple bump electrodes, respectively, and the lands and the corresponding bump electrodes are connected to each other, it is important that all the lands and the corresponding bump electrodes are favorably connected to each other, in order to ensure reliability.

However, typically, lands and bump electrodes are each made of a metal. Therefore, if misalignment occurs when joining these electrodes together or misalignment occurs between these electrodes since the positioning accuracy of the lands and bump electrodes is low, sufficient bonding strength between the lands and bump electrodes is not obtained. Thus, there is a possibility that a contact failure (electrical connection failure) will occur.

Also, warpage in the substrate or the electronic component, such as an IC, or unevenness in the height of the formed lands, bump electrodes, or the like makes inconsistent the distances between the lands and bump electrodes. For this reason, sufficient bonding strength between the lands and bump electrodes is not obtained and there is a possibility that a contact failure (electrical connection failure) will occur.

In order to prevent such a problem, there have been provided printed wiring boards where a conductive pattern having a trapezoidal section is provided, a metal conductive layer is formed on the conductive pattern, and many recesses and protrusions are made on a surface of the metal conductive layer (for example, see JP-A-2002-261407).

It is believed that, by using such a printed wiring board, an anchor effect obtained by the recesses and protrusions on the surface of the metal conductive layer prevents slides of the connection electrodes of the component (electronic component) on the electrodes of the substrate, fall and inclination of the connection electrodes, or the like even if pressure is applied to the component when mounting the component, and thus the mounting yield is increased.

However, even the printed wiring board having the above-mentioned advantage does not have a structure where the bonding strength between a connection electrode and a substrate electrode is increased and, further, the bonding strength between multiple connection electrodes and substrate electrodes is increased. Therefore, if misalignment occurs at the time of joining these electrodes together or misalignment occurs between these electrodes since the positioning accuracy between these electrodes (between the lands and bump electrodes) is low, sufficient bonding strength between these electrodes is not obtained and there remains a possibility that a contact failure (electrical connection failure) will occur. Also, since the connection electrodes (bump electrodes) are made of a metal, the connection electrodes become deformed plastically when connected to the lands. Therefore, the connection electrodes are lacking in the capability of, if the distances between the lands and bump electrodes are made inconsistent as described above, absorbing the distance changes by becoming deformed elastically. For this reason, sufficient bonding strength between these electrodes is not obtained, and there remains a possibility that a contact failure (electrical connection failure) will occur.

Also, in the above-mentioned joining structure (mounting structure) between the printed wiring board having the metal conductive layer and the component including the connection electrodes, a bonding material, such as an underfill material, is required to mount and fix the component on the printed wiring board. This is a factor that prevents a reduction in the cost required for mounting.

SUMMARY

An advantage of the invention is to provide an electronic component mounting structure that is allowed to increase the bonding strength between bump electrodes and substrate terminals so that the reliability of electrical connection is increased and the manufacture is facilitated.

An electronic component mounting structure according to an aspect of the invention includes: an electronic component including a plurality of bump electrodes that includes a base resin provided on an active face of the electronic component and a plurality of conductive films that cover a part of a surface of the base resin, expose an area excluding the part of the surface, and are electrically coupled to a plurality of electrode terminals provided on the active face; and a substrate including a plurality of terminals. In the structure, the electronic component is mounted on the substrate, and the base resin includes: a first opening surrounding the plurality of the electrode terminals; a connection portion in which a part of one ends of the plurality of the conductive films that are drawn out on the surface of the base resin is disposed, the other ends of the conductive films being coupled to the electrode terminals; and a bonding portion that is bonded to the substrate, and is formed in an area excluding the first opening and the connection portion, and an elastic deformation of the base resin at the connection portion allows the bonding portion to bond the substrate so as to maintain the conductive films and the plurality of the terminals on the substrate in a bonded state.

In the above-mentioned configuration, the base resin has the first opening surrounding the multiple electrode terminals provided on the active face of the electronic component. The base resin provided around the multiple electrode terminals prevents moisture from intruding into the electrode terminals. This prevents, for example, occurrence of migration at the junctions of the electrode terminals and conductive films, thereby increasing connection reliability.

Also, due to elastic deformation of the base resin at the connecting portion, the bonding portion is bonded to the substrate and the connection between the conductive films and the terminals on the substrate is maintained. Thus, connection between the bump electrodes and terminals on the substrate is ensured. This also increases the reliability of electrical connection.

In the electronic component mounting structure according to the aspect of the invention, the base resin preferably has a second opening that exposes the active face. Also, the conductive films preferably extend from the first opening, pass over the base resin, and extend into the second opening.

In the above-mentioned configuration, the conductive films extend from the first opening into the second opening; therefore, the base resin between the first opening and second opening and the conductive films on the base resin form the bump electrodes. Such bump electrodes make point-contact with the terminals on the substrate at the start of mounting, and the bump electrodes make surface-contact therewith at the completion of mounting. Thus, stable electrical connection is achieved.

In the electronic component mounting structure according to the aspect of the invention, electrical contact of the bump electrodes with the terminals is preferably maintained by an adhesive force of the bonding portion of the base resin to the substrate.

By adopting the above-mentioned configuration, the need to dispose a bonding material, such as an underfill material, between the substrate and electronic component is eliminated. Therefore, the cost required for a bonding material, such as an underfill material, is reduced. Also, the need to perform the step of disposing such a bonding material is eliminated so that the manufacturing cost is reduced. This reduces the mounting cost.

In the electronic component mounting structure according to the aspect of the invention, a protruding line portion, a cross section of which has a shape of a rough semicircle, a rough semi-ellipse, or a rough trapezoid, is preferably formed on at least a part of the base resin. Also, the conductive films are preferably provided in the form of stripes on a part of the surface along a direction of the cross section of the base resin.

In the above-mentioned configuration, the conductive films are provided on the surface of the base resin at intervals. Thus, the multiple bump electrodes are formed and the manufacture is facilitated. Also, by forming the protruding line portion on a part of the base resin, the bump electrodes that can achieve stable electrical connection are obtained.

Also, the electronic component is preferably a semiconductor element.

By adopting the above-mentioned configuration, the semiconductor element is connected to the substrate with the base resin therebetween. Thus, transmission of stress to the semiconductor element is restrained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Now, electronic component mounting structures according to embodiments of the invention will be described in detail.

First Embodiment

Figure 1:
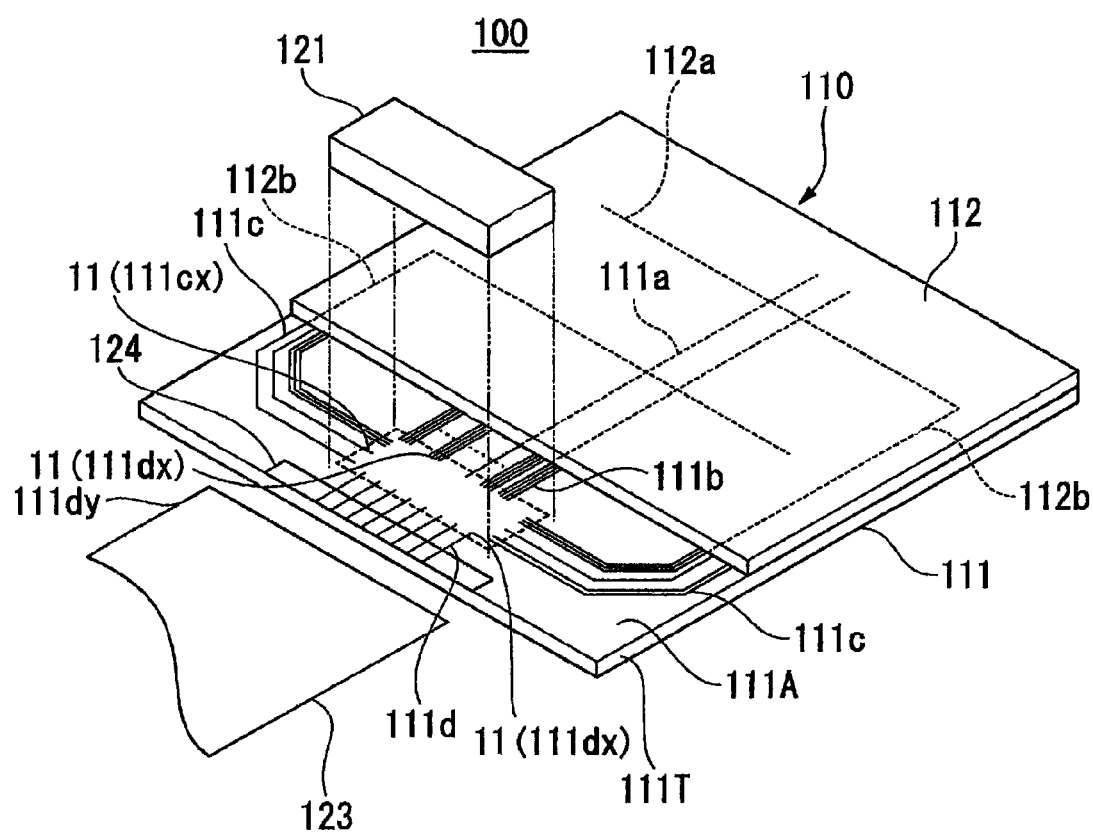
FIG. 1 is a schematic perspective view showing a structure of a liquid crystal display to which an electronic component mounting structure according to a first embodiment of the invention is applied.

FIG. 1 is a schematic view showing a liquid crystal display to which an electronic component mounting structure according to a first embodiment of the invention is applied. First, an application example of the electronic component mounting structure according to this embodiment will be described with reference to FIG. 1.

In FIG. 1, a liquid crystal display 100 includes a liquid crystal panel 110 and an electronic component (liquid crystal-driving IC chip) 121. Note that the liquid crystal display 100 is provided with ancillary members (not shown), such as a polarizing plate, a reflection sheet, and a backlight, as necessary.

The liquid crystal panel 110 includes substrates 111 and 112 made of glass or synthetic resin. The substrate 111 and substrate 112 are disposed as opposed to each other, and bonded together using a sealing material (not shown). Liquid crystal (not shown), which is an electrooptic material, is sealed between the substrate 111 and substrate 112. Electrodes 111*a* made of a translucent, conductive material such as ITO (indium tin oxide) are formed on a surface 111A of the substrate 111. Electrodes 112*a* are formed on the inner surface of the substrate 112 as opposed to the electrode 111*a*.

The electrodes 111*a* are connected to wiring lines 111*b* formed integrally using an identical material and then drawn out onto the inner surface of a substrate extension portion 111T provided on the substrate 111. The substrate extension portion 111T is a portion extending out of the external shape of the substrate 112 at an edge of the substrate 111. Ends of the wiring lines 111*b* serve as terminals 111*bx*. Also, the electrodes 112*a* are connected to wiring lines 112*b* formed integrally using an identical material and then electrically connected to wiring lines 111*c* on the substrate 111 via upper and lower conduction portions (not shown). The wiring lines 111*c* are also made of ITO. The wiring lines 111*c* are drawn out onto the substrate extension portion 111T, and ends thereof serve as terminals 111*cx*. Input wiring lines 111*d* are formed near an edge of the substrate extension portion 111T, and ends thereof serve as terminals 111*dx*. The terminals 111*dx* are disposed as opposed to the terminals 111*bx* and terminals 111*cx*. The other ends of the input wiring lines 111*d* serve as input terminals 111*dy*.

The electronic component 121 according to this embodiment is directly mounted on the substrate extension portion 111T with no NCP (non-conductive paste) or NCF (non-conductive film) interposed therebetween.

The electronic component 121 is, for example, a liquid crystal-driving IC chip that drives the liquid crystal panel 110. Many bump electrodes (not shown) according to this embodiment are formed on the lower surface of the electronic component 121. These bump electrodes are electrically connected to the terminal 111bx, 111cx, and 111dx on the substrate extension portion 111T. In the above-mentioned way, the mounting structure according to this embodiment where the electronic component 121 is mounted on the substrate 111 is formed.

Also, a flexible wiring substrate 123 is mounted on the arrangement area of the input terminals 111dy on the substrate extension portion 111T with an anisotropic conductive film 124 between the flexible wiring substrate 123 and arrangement area. The input wiring lines 111d are electrically connected to corresponding wiring lines (not shown) provided on the flexible wiring substrate 123. Control signals, video signals, power supply potentials, and the like are provided to the input terminals 111dy from the outside via the flexible wiring substrate 123. The control signals, video signals, power supply potentials, and the like provided to the input terminals 111dy are inputted into the electronic component 121. In the electronic component 121, drive signals for driving liquid crystal are generated and then provided to the liquid crystal panel 110. The flexible substrate is a flexible, organic substrate, such as polyimide or liquid crystal polymers. Typically, a circuit pattern or a terminal is formed on the substrate using copper or aluminum and doing so is preferable, but necessarily limited thereto. It is more preferable that surfaces of the terminals thereof be plated using gold, since the connection resistance is stabilized.

According to the liquid crystal display 100 configured above, when appropriate voltages are applied between the electrodes 111a and electrodes 112a via the electronic component 121, light is modulated independently for each of pixels formed in the areas where the electrodes 111a and electrodes 112a are disposed as opposed to each other. Thus, desired images are formed on the display area of the liquid crystal panel 110.

Next, the electronic component mounting structure according to this embodiment applied to the liquid crystal display 100 will be described in detail.

Figure 2A:
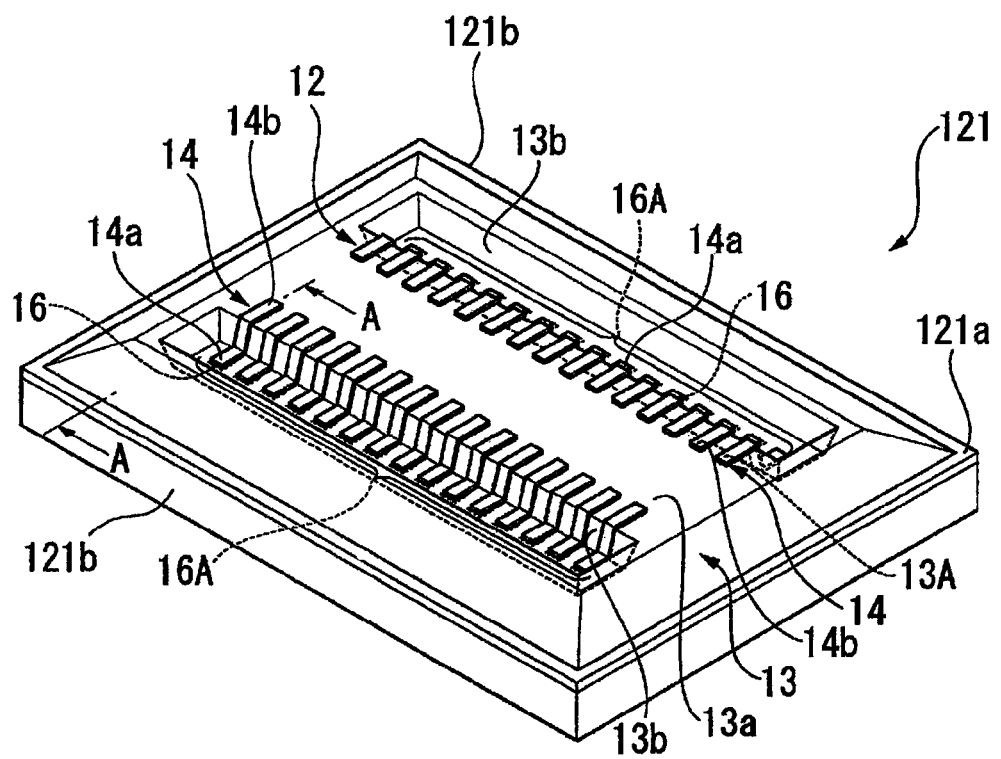
FIG. 2A is a perspective view of an active face of an electronic component.
Figure 2B:
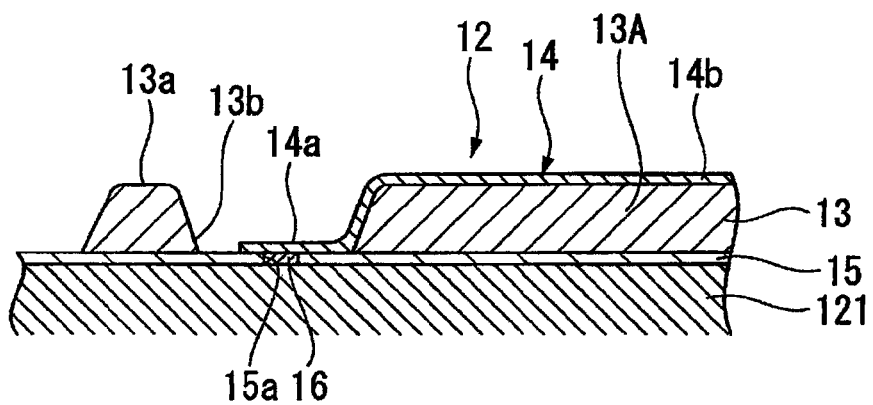
FIG. 2B is a partial sectional view of FIG. 2A.
Figure 3A:
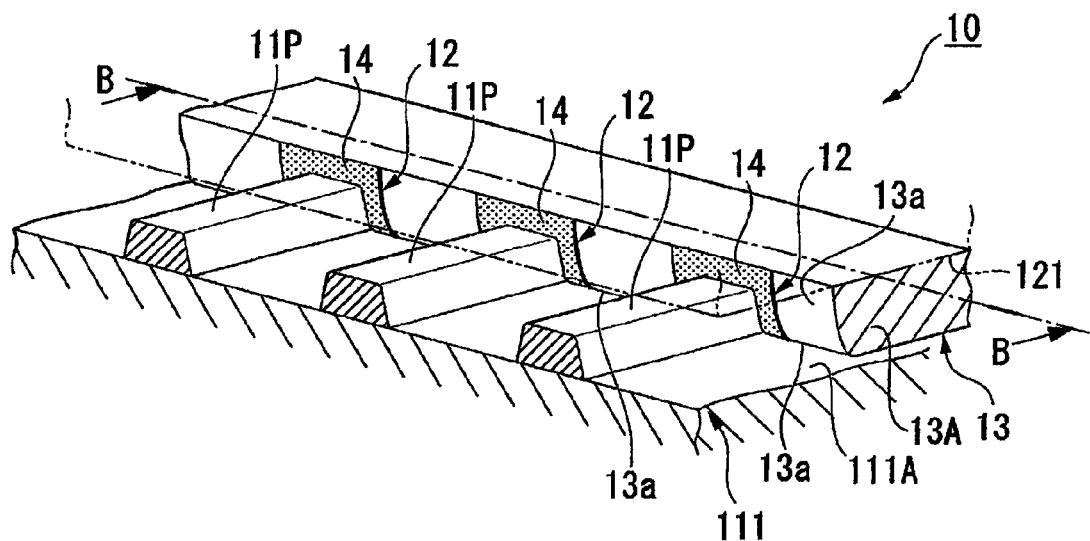
FIG. 3A is an enlarged perspective view of a major part of the mounting structure.
Figure 3B:
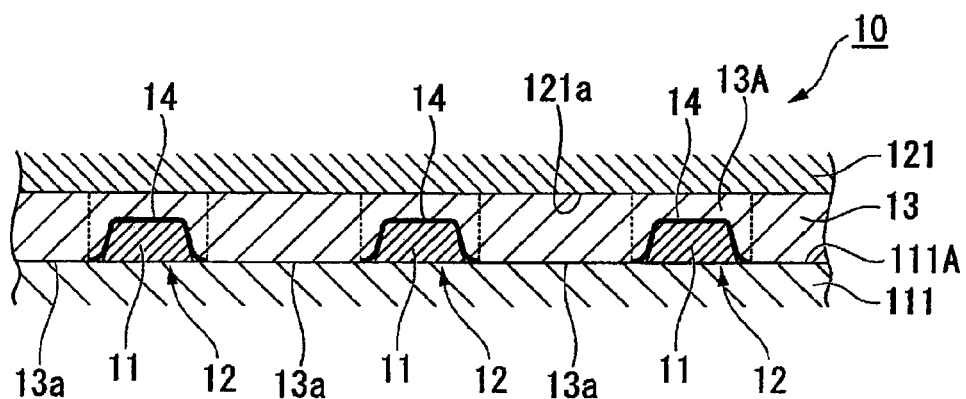
FIG. 3B is a partial sectional view of FIG. 3A.

First, the structure of the electronic component according to this embodiment will be described. FIG. 2A is a perspective view of an active face 121a of the electronic component 121. FIG. 2B is a sectional view as seen in the direction of arrows A-A of FIG. 2A. FIG. 3A is an enlarged perspective view showing a major part of the mounting structure. FIG. 3B is a sectional view as seen in the direction of arrows B-B of FIG. 3A. In FIG. 3A, reference numerals 11P represent the wiring patterns provided on the substrate 111, that is, any one of the wiring lines 111b, wiring lines 111c, and wiring lines 111d. Also, in FIG. 3B, reference numerals 11 represent the terminals provided on these wiring lines, that is, any one of the terminals 111bx, terminals 111cx, and terminals 111dx. In this embodiment, the terminals 11 have a relatively large film thickness and are therefore formed with a large height, and cross sections thereof each take the shape of a rough trapezoid.

As shown in FIGS. 2A and 2B, many bump electrodes 12 electrically connected to the terminals 11 (terminals 111bx, terminals 111cx, and terminals 111bx) of the substrate 111 are formed on the electronic component 121. The bump electrodes 12 each include a base resin 13 provided on the active face 121a of the electronic component 121 and a conductive film 14 that covers a part of a surface of the base resin 13 and exposes the remaining surface.

The base resin 13 is provided in such a manner that the base resin covers the approximately entire active face 121a except for portions of the active face 121a corresponding to electrode terminals 16. That is, the base resin 13 is formed in the form of a square frustum or a square plate on the rectangular active face 121a of the electronic component 121. Two openings (first openings) 13b are made on the base resin 13 according to this embodiment in such a manner that the openings surround the multiple electrode terminals 16 provided on the active face 121a of the electronic component 121. All the electrode terminals 16 on the active face 121a are exposed along the openings 13b. More specifically, two terminal lines 16A made up of the multiple electrode terminals 16 are disposed in parallel on the active face 121a of the electronic component 121 along both long sides 121b of the electronic component 121. The openings 13b are made as corresponding to the terminal lines 16A.

As shown in FIG. 2A, the multiple electrode terminals 16 constituting each terminal line 16A are disposed in one opening 13b. The base resin 13 is patterned so that the openings 13b commonly used by the multiple electrode terminals 16 are formed. The number of electrode terminals 16 constituting each terminal line 16A is set as appropriate. While all the electrode terminals 16 are not shown in FIG. 2A, about 2000 electrode terminals 16 are disposed actually.

Ends 14a of the stripe-shaped conductive films 14 are joined (electrically connected) to the multiple electrode terminals 16 exposed in each opening 13b. On the other hand, ends 14b opposite to the ends 14a, of the conductive films 14 are drawn out onto the base resin 13 and provided as covering parts of the surface of the base resin 13. The base resin 13 forms a protruding line portion (a protruding portion that is long in the in-plane direction), a cross section of which takes the shape of a rough trapezoid, between the openings 13b. The conductive films 14 are provided in the form of stripes along the direction of the cross section. The multiple conductive films 14 are disposed in the length direction of the protruding line portion.

As for the bump electrodes 12 having the above-mentioned configuration, portions covered by the conductive films 14, of the base resin 13 in FIGS. 2A and 2B serve as connecting portion 13A to be connected to the terminals 11 on the substrate 111. Parts of the conductive films 14 on the connecting portion 13A substantially function as electrodes.

As shown in FIG. 2B, the conductive films 14 are connected and electrically connected to the electrode terminals 16 exposed in an opening 15a of an insulating film 15 on the surface of the electronic component 121 and are drawn onto the base resin 13. The conductive films 14 configured as described above independently function as the bump electrodes 12 according to this embodiment together with the base resin 13 located inside each conductive film 14.

Also, in this embodiment, a part of the exposed area of the base resin 13 that is not covered by the conductive films 14 serves as a bonding portion 13a to be bonded to the substrate 111. Specifically, the area of the base resin 13 except for the openings 13b and connecting portion 13A serves as the bonding portion 13a.

As shown in FIGS. 3A and 3B, the electronic component 121 having the above-mentioned configuration is mounted on the substrate 111 in such a manner that the bump electrodes 12 are electrically connected to the terminals 11 (terminal 111bx, 111cx, and 111dx) of the substrate 111. In this case, the connecting portion 13A of the base resin 13 is deformed elastically; therefore, the bonding portion 13a is directly connected to the surface 111A of the substrate 111. Thus, the electronic component 121 is reliably mounted on the substrate 111.

The base resin 13 is a thermally-adhesive, insulating resin that exhibits adhesiveness when the electronic component 121 is crimped onto the substrate 111 and heated in the process of mounting the electronic component 121 on the substrate 111. Specifically, as the base resin 13, a polyimide resin, BCB (benzocyclobutene), liquid crystal polymers, various thermoplastic resins, and the like are used. Also, photosensitive, insulating resins or thermosetting, insulating resins having thermoplastic components may be used.

Also, the base resin 13 may be a thermosetting resin, a photosensitive resin, or a combination of these resins, which can be bonded to the substrate 111.

Specifically, if a thermosetting resin (containing thermoplastic components), such as polyimide, is used as the base resin 13, the base resin 13 is heated in such a manner that the base resin 13 remains in a semi-cured state without being completely cured, in the process of forming the bump electrodes 12. Subsequently, when mounting the electronic component 121, the base resin 13 is heated and completely cured in a state where a part thereof is brought into contact with the substrate 111. In this case, the base resin 13 that has retained adhesiveness in a semi-cured state is bonded to the substrate 111 while being pressurized and heated and thus cured. Subsequently, the base resin 13 is completely cured so that the joining state is maintained. If a photosensitive resin is used as the base resin, a step of causing the base resin to exhibit a property where the base resin can be connected to the substrate, such as a step of applying light to the base resin, is performed.

Alternatively, if a thermoplastic resin (the thermoplastic resin may contain thermosetting components as necessary) is used as the base resin 13, the base resin 13 is completely cured in the process of forming the bump electrodes 12. Next, when mounting the electronic component 121, the base resin 13 is heated in a state where a part thereof is brought into contact with the substrate 111 and crimped onto the substrate 111. Thus, the base resin 13 is partially molten and softened. As a result, the base resin 13 exhibits adhesiveness.

Subsequently, the base resin 13 is cooled down so that the base resin is cured again. As seen, the base resin 13 is bonded to the substrate 111 while being molten and softened and then cooled down and cured. Subsequently, the base resin 13 is completely cured so that the joining state is maintained.

If the base resin 13 is formed using a thermoplastic resin as described above and if a failure such as misalignment occurs after the electronic component 121 is mounted on the substrate 111 using the adhesiveness of the base resin 13, the electronic component 121 can be easily remounted from the substrate 111 by reheating and thus softening the base resin 13.

The base resin 13 made of such as a resin has the protruding line portion, a section of which takes the shape of a rough trapezoid, and which is formed using known lithography, printing, dispensing, or etching. The material (hardness) of the resin, the shapes (heights and widths) of particular parts of the protruding line portion, and the like are selected or designed on the basis of the shape or size of the terminals 11, or the like as appropriate.

The conductive films 14 are made of a metal, such as Au, TiW, Cu, Cr, Ni, Ti, W, NiV, Al, Pd, or lead-free solder, or an alloy and may be formed of a single layer of such a metal (alloy). Also, the conductive films 14 may be a single layer of any one of these metals (alloy) or may be a lamination of layers made of two or more among these metals. Also, the conductive films 14 may be formed by making films using a known film-making method, such as sputtering, and then patterning the films into stripes or may be formed selectively using electroless plating. Also, the conductive films 14 may be multilayer films each including a base film formed using sputtering or electroless plating and an upper-layer film formed on the base film using electrolytic plating.

As with the base resin 13, the type or layer structure of the metal (alloy), film thickness, width, and the like are selected or designed on the basis of the shape or size of the terminals 11, or the like as appropriate. However, the conductive films 14 themselves become deformed elastically as the base resin 13 (connecting portion 13A) becomes deformed elastically; therefore, gold (Au) having good ductility is preferably used.

Also, if the conductive films 14 are formed using multilayer films, gold is preferably used as the outermost layer thereof. Also, the width of the conductive films 14 is preferably made sufficiently wider than that of the terminals 11 to which the conductive films 14 are to be connected.

Figure 4A:
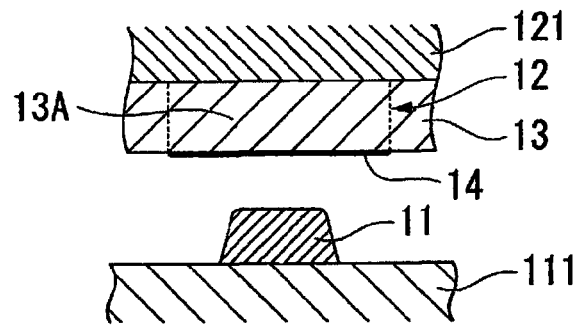
FIGS. 4A to 4D are drawings showing the mounting structure according to the first embodiment of the invention.

FIG. 4A is a drawing showing a state before the electronic component 121 is mounted on the substrate 111 and is an enlarged sectional view of the major part shown in FIG. 3B. As described above, if a thermosetting resin is used as the base resin 13, the base resin 13 is placed in a semi-cured state. Also, if a thermoplastic resin is used as the base resin 13, the base resin 13 is placed in a completely cured state. Thus, the base resin 13 is placed in a thermally adhesive state.

Figure 4B:
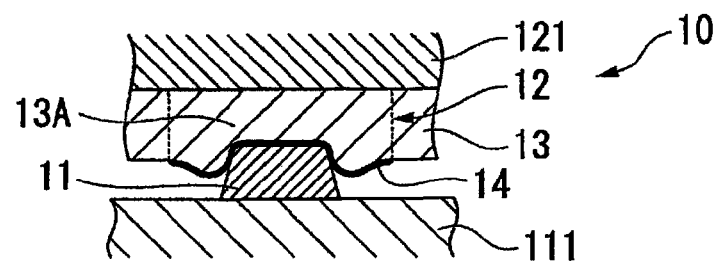
Figure 4C:
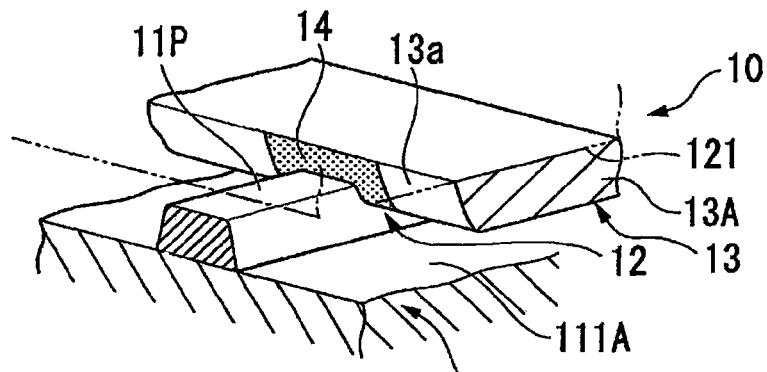

The substrate 111 and electronic component 121 are positioned so that the terminals 11 and the corresponding bump electrodes 12 are opposed to each other. Then, in this state, the substrate 111 and electronic component 121 are pressurized in directions in which they are bonded together. Thus, as shown in FIGS. 4B and 4C, the conductive films 14 of the bump electrodes 12 are bonded to the terminals 11 and brought into electrical contact therewith. At the same time that this pressurization is performed, heating is also performed. The heating temperature is set on the basis of the type of the base resin 13, or the like as appropriate.

Figure 4D:
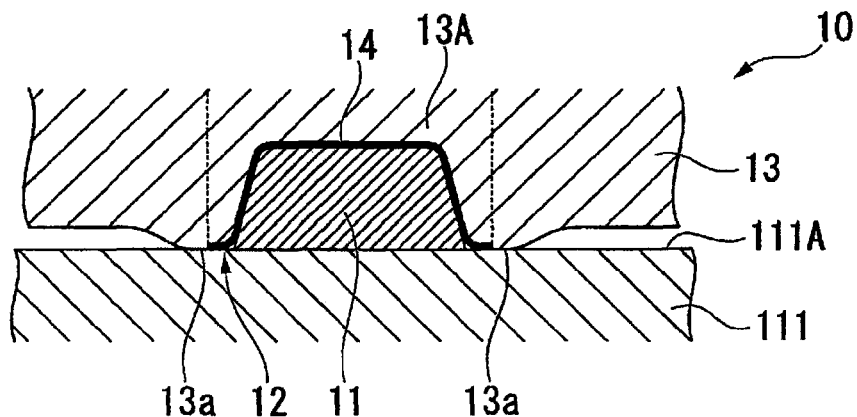

Subsequently, the pressurization is further performed in a state where the conductive films 14 and terminals 11 are in electrical contact with each other as described above. Thus, the bump electrodes 12 are crimped onto the substrate 111. Accordingly, as shown in FIG. 4D, the connecting portion 13A of the base resin 13 is further compressed and deformed. Subsequently, a part of the exposed bonding portion 13a that is not covered by the conductive films 14, of the base resin 13 is directly bonded to the substrate 111.

Subsequently, when the pressurization is further performed, the approximately entire surfaces of the bump electrodes 12 and the approximately entire surface of the bonding portion 13a of the base resin 13 are directly bonded to the substrate 111, as shown in FIG. 3B. Subsequently, the base resin 13 is cured (completely cured) in this state as described above. Thus, the bonding portion 13a of the base resin 13 is favorably bonded to the substrate 111.

By joining the bonding portions 13a of the base resin 13 to the substrate 111 as described above, the electronic component 121 is mounted on the substrate 111. Also, the electrical contact of the bump electrodes 12 with the terminals 11 is maintained by the adhesiveness of the bonding portions 13a. Thus, the mounting structure 10 according to the first embodiment is obtained.

In the mounting structure 10 according to the first embodiment formed in the above-mentioned way, the base resin 13 is formed in such a manner that the base resin 13 covers the approximately entire active face 121a of the electronic component 121 except for the portions corresponding to the two terminal lines 16A made up of the multiple electrode terminals 16. That is, by making the openings 13b commonly used by the multiple electrode terminals 16 making up the terminal lines 16A, it is possible to stably pattern-form the openings 13b on the base resin 13 even if the electrode terminals 16 are designed minutely. If a minute opening is made for each electrode terminal 16, adjacent openings easily interfere with each other. This makes patterning difficult. However, in this embodiment, one opening 13b is made for multiple electrode terminals 16 rather than for each electrode terminal 16. This reduces the number of independent openings and makes it easy to make the openings 13b.

Also, since the base resin 13 is provided as surrounding the multiple electrode terminals 16, moisture does not easily intrude into the electrode terminals 16 so that the reliability with respect to the leakage (migration) of a current is significantly increased.

Also, by making the openings 13b corresponding to the terminal lines 16A on the base resin 13, the portion that is not covered by the conductive films 14 is widened (enlarged). Therefore, the area of the bonding portion 13a directly bonded to the substrate 111 is increased. Thus, the strength with which the electronic component 121 is mounted on the substrate 111 is increased.

In the mounting structure 10 according to this embodiment, the electronic component 121 is relatively pressurized toward the substrate 111. Thus, the bump electrodes 12 are brought into contact with the terminals 11 and further pressurized in this state. Thus, the base resin 13 (connecting portion 13A) of the bump electrodes 12 further become deformed elastically (compressed and deformed), and the approximately entire surface of the bonding portion 13a of the base resin 13 is bonded to the substrate 111. Since the bump electrodes 12 generate elasticity restoring force (repulsion) against the terminals 11 of the substrate 111 due to the elastic deformation of the base resin 13 (connecting portion 13A), the bonding strength between the bump electrodes 12 and terminals 11 is further increased, and the reliability of electrical connection is increased.

Also, as described above, the electrical contact of the bump electrodes 12 with the terminals 11 is maintained by the adhesiveness of the bonding portion 13a of the base resin 13 to the substrate 111. This eliminates the need to fill (dispose) an underfill material (bonding material), such as NCP, between the substrate 111 and electronic component 121. Therefore, the cost required for the bonding material is reduced. Also, the need to perform the step of disposing such a bonding material is eliminated so that the manufacturing cost is reduced. This makes it possible to reduce the mounting cost. Also, since the bonding portion 13a of the base resin 13 located between the conductive films 14 is brought into direct contact with the surface of the substrate 111, migration between the bump electrodes 12 adjacent to each other with the bonding portion 13a therebetween is restrained by the insulating base resin 13.

In the mounting structure 10 according to the first embodiment, the electronic component 121 is mounted on the substrate 111 so that the approximately entire surface of the bonding portion 13a of the base resin 13 is directly bonded to the substrate 111, as shown in FIG. 2B; however, if the base resin 13 has sufficiently high adhesiveness, the base resin 13 may be completely cured in a state where only parts of the bonding portion 13a are directly bonded to the substrate 111, as shown in FIG. 4D. Even in this case, the electrical contact between the bump electrodes 12 and terminals 11 is favorably maintained by the adhesiveness of the bonding portion 13a.

This eliminates the need to fill (dispose) an underfill material (bonding material) between the substrate 111 and electronic component 121.

Next, other embodiments of the present invention will be described. The basic configurations of electronic component mounting structures according to other embodiments are approximately the same as that of the above-mentioned embodiment except that the formers are different from the latter with respect to the structure of the electronic component. Accordingly, hereafter, the structures of the electronic components will be described and the common elements will not be described. Also, in the drawings to be used for description, same elements as those in FIGS. 1 to 4 will be assigned same reference numerals.

Second Embodiment

Figure 5A:
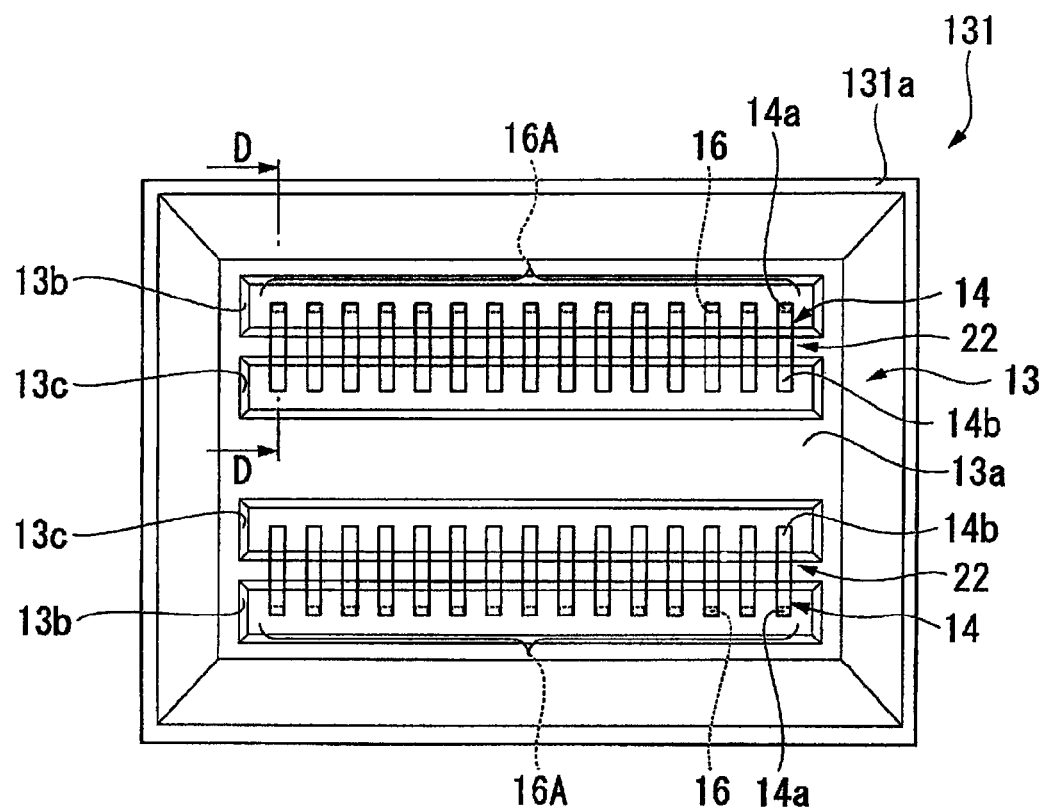
FIG. 5A is a plan view of an active face of an electronic component according to a second embodiment of the invention.
Figure 5B:
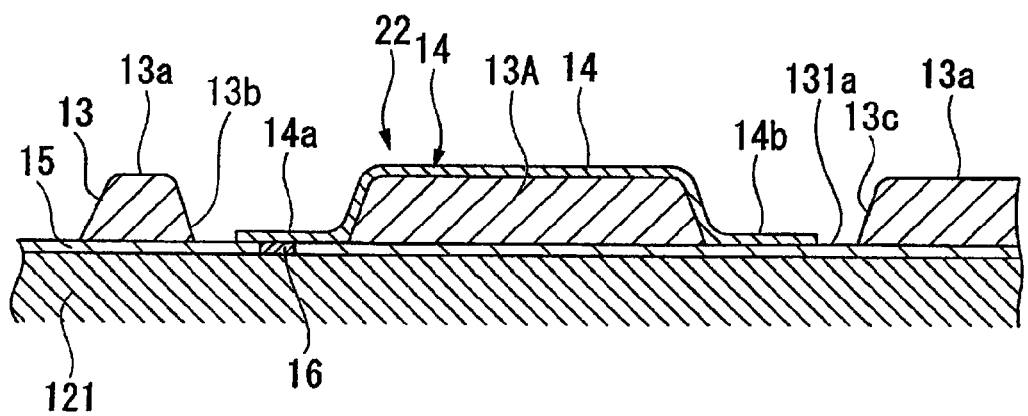
FIG. 5B is a partial sectional view of FIG. 5A.

Hereafter, a second embodiment of the invention will be described. FIG. 5A is a plan view of an active face 131a of an electronic component 131 according to the second embodiment. FIG. 5B is a sectional view as seen in the direction of arrows D-D of FIG. 5A.

In the electronic component 131 according to this embodiment, two openings 13b and two openings 13c (second openings), that is, a total of four openings are made on the base resin 13. Specifically, in addition to the openings 13b made for the terminal lines 16A, the openings 13c that are located inside the openings 13b and extend in parallel with the openings 13b are made. The openings 13c have approximately the same size as that of the openings 13b and each take the shape of a rectangle in a plan view. Each opening 13c is made near the corresponding opening 13b at a predetermined distance from the opening 13b.

As in the above-mentioned embodiment, the multiple electrode terminals 16 are disposed in each opening 13b, and the ends 14a of the conductive films 14 are connected to the electrode terminals 16. The conductive films 14 are drawn out of the openings 13b and cover parts of the surface of the base resin 13. The ends 14b opposite to the ends 14a, of the conductive films 14 are inserted into the openings 13c. Also, the ends 14b are bonded to parts of the active face 131a exposed in the openings 13c. The conductive films 14 are drawn out of the openings 13b, pass over the surface of the base resin 13, and extend into the openings 13c.

In this embodiment, the portions of the base resin 13 that are located between the openings 13b and openings 13c and are covered by the conductive films 14 serve as connecting portion 13A to be connected to the terminals 11 on the substrate 111. Parts of the conductive films 14 on the connecting portion 13A substantially function as electrodes. The connecting portion 13A of the base resin 13 form protruding line portions, a cross section of each of which takes the shape of a rough trapezoid. The connecting portion 13A of the base resin 13 as described above and the parts of the conductive films 14 covering the connecting portion 13A constitute the bump electrodes 22 according to this embodiment.

The electronic component 131 having such a configuration is mounted on the substrate 111 in a state where the bonding portion 13a is bonded to the substrate 111 due to elastic deformation of the connecting portion 13A of the base resin 13 included in the bump electrodes 22 and where the connection between parts of the conductive films 14 and the terminals 11 on the substrate 111 is maintained.

In the second embodiment configured as described above, the base resin 13 is formed in such a manner that the base resin 13 covers the approximately entire active face 131a except for the portions thereof corresponding to the terminal lines 16A made up of the multiple electrode terminals 16 and the portions thereof corresponding to the ends 14b of the multiple conductive films 14 connected to the electrode terminals 16 making up the terminal lines 16A. Thus, the same advantages as those of the above-mentioned embodiment are obtained. Also, contacts that are inherent to the resin core and each has a convex section similar to a hemisphere, are obtained. Specifically, the bump electrodes 22 according to this embodiment make point-contact with the terminals 11 of the substrate 111 at the start of mounting and make surface-contact therewith at the completion of mounting. Thus, stable electrical connection between the bump electrodes 22 and the terminals 11 of the substrate 111 is achieved.

Also, both the ends 14a and 14b of the conductive films 14 are fixed to the active face 131a of the electronic component 131. Thus, this embodiment has a structure where the strength with which the conductive films 14 is connected to the electronic component 131 is higher than that in the above-mentioned embodiment where the ends 14b opposite to the ends 14a connected to the electrode terminals 16 are joined onto the base resin 13.

Third Embodiment

Figure 6:
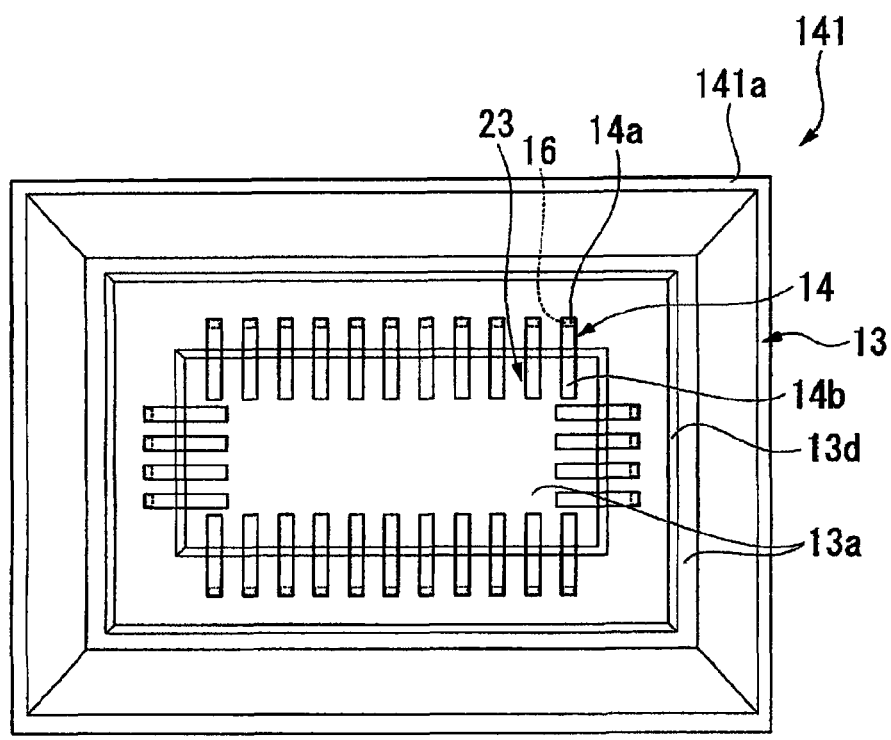
FIG. 6 is a plan view of an active face of an electronic component according to a third embodiment of the invention.

Next, a third embodiment of the invention will be described. FIG. 6 is a plan view of an active face 141a of an electronic component 141 according to the third embodiment.

In the electronic component 141 according to this embodiment, one opening 13d is made on the base resin 13 in the form of a frame along the four sides of the electronic component 141. The opening 13d is commonly used by the all the electrode terminals 16 provided on the active face 141a, and all the electrode terminals 16 provided on the active face 141a are disposed inside the opening 13d. These electrode terminals 16 are disposed along the circumference direction of the opening 13d, and multiple electrode terminals 16 are disposed along each side of the electronic component 141. The portion of the base resin 13 surrounded by the opening 13d forms a protruding line portion, a cross section of which takes the shape of a rough trapezoid.

The conductive films 14 are provided in such a manner that the ends 14a thereof are connected to the electrode terminals 16 and that the ends 14b thereof opposite to the ends 14a are drawn out of the opening 13d and cover parts of a surface of the area (protruding line portion) surrounded by the opening 13d, of the base resin 13. All the conductive films 14 of the electronic component 141 are provided in such a manner that the ends 14b thereof are directed toward the center of the electronic component 141.

The portions covered by the conductive films 14, of the base resin 13 serve as connecting portion 13A to be connected to the terminals 11 on the substrate 111. Parts of the conductive films 14 on the connecting portion 13A substantially function as electrodes. Bump electrodes 23 according to this embodiment are made up of the connecting portion 13A, which as parts of the base resin 13, and the parts of the conductive films 14 covering the connecting portion 13A.

In a state where the electronic component 141 is mounted on the substrate 111, the connecting portion 13A of the base resin 13 included in the bump electrodes 23 are elastically deformed; therefore, the bonding portion 13a that is a portion of the base resin 13 other than the connecting portion 13A is bonded to the surface 111A of the substrate 111, and the parts of the conductive films 14 included in the bump electrodes 23 and the terminals 11 of the substrate 111 are reliably connected to each other.

In the third embodiment having such a configuration, the opening 13d commonly used by all the electrode terminals 16 provided on the active face 141a is pattern-formed on the base resin 13. By adopting this configuration, the one opening 13d can correspond to the electrode terminals 16 even if the electrode terminals 16 are designed more minutely. Thus, the manufacture is facilitated. That is, the number of independent openings is smaller than those of the above-mentioned embodiments and the size of the opening is larger than those of the above-mentioned embodiments, so this embodiment has an advantage that the opening 13d is easily pattern-formed on the base resin 13.

Modification

Figure 7:
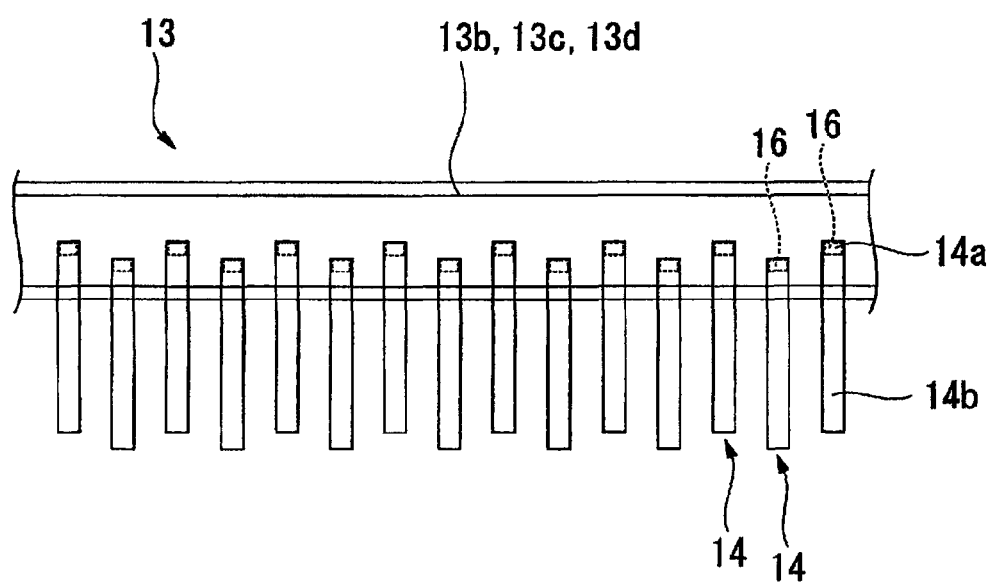
FIG. 7 is a drawing showing an example disposition of terminals.

The multiple electrode terminals 16 disposed inside the openings 13b, openings 13c, and opening 13d in the above-mentioned embodiments do not always need to be arranged in a line. For example, as shown in FIG. 7, the adjacent electrode terminals 16 may be disposed in a staggered (zigzag) manner rather than in a line. That is, the openings 13b, openings 13c, and opening 13d are formed in such a manner that these openings are commonly used by the multiple electrode terminals 16; therefore, misalignment of the electrode terminals 16 can be also addressed unlike a case where an independent opening is pattern-formed for each electrode terminal 16. Thus, the manufacture is facilitated.

Also, the openings in the above-mentioned embodiments may be made variable as necessary.

While the exemplary embodiments of the invention have heretofore been described with reference to the accompanying drawings, the invention is not limited thereto and the above-mentioned embodiments may be combined. It will be apparent for those skilled in the art that various changes and modifications can be made to the embodiments without departing from the technical idea described in the appended claims. Therefore, it will be understood by those skilled in the art that such changes and modifications also fall within the technical scope of the invention.

For example, as the substrate 111, various substrates, such as a rigid substrate, a silicon substrate, and a thin ceramic substrate, as well as the above-mentioned substrate made of glass or synthetic resin may be used. Also, the electronic component may be any electronic component as long as it is an electronic component including connection electrodes (bump electrodes) as described above. For example, various ICs and passive components, such as a diode, a transistor, a light-emitting diode, a laser diode, an oscillator, and a capacitor, as well as the liquid crystal-driving IC chip may be used.

Apparatuses to which the electronic component mounting structure according to the invention is applicable include not only the above-mentioned liquid crystal display but also various electrooptic apparatuses, such as organic electroluminescence apparatuses (organic EL apparatuses), plasma displays, electrophoresis displays, and apparatuses using an electron emission element (field emission displays, surface-conduction electron-emitter displays, etc.), and various electronic modules.

The entire disclosure of Japanese Patent Application No. 2008-244040, filed Sep. 24, 2008 is expressly incorporated by reference herein.

What is claimed is:

1. An electronic component mounting structure, comprising:
   an electronic component that includes an active face;
   a first plurality of terminals that are provided on the active face and that are formed in first and second rows parallel to each other;

a base resin that is provided on the active face and that includes a top surface;

a first opening that is provided at the base resin to expose the first row of the first plurality of terminals;

a second opening that is provided at the base resin to expose the second row of the first plurality of terminals;

a plurality of conductive films, each of the plurality of conductive films is electrically connected to each of the first and second rows of the first plurality of terminals, and the plurality of conductive films extend toward and are provided on a connecting portion of the base resin in a direction perpendicular to the first and second openings so that ends of the plurality of conductive films are located on the connecting portion of the base resin; and a substrate that includes a second plurality of terminals, wherein sides of the first and second openings are surrounded by the base resin, when the electronic component is mounted on the substrate, each of the ends of the plurality of conductive films is connected to each of the second plurality of terminals of the substrate, and when the electronic component is mounted on the substrate, the top surface, which is provided between the first and second openings of the base resin, is bonded to the substrate by elastically deforming the base resin located at the connecting portion.

2. The electronic component mounting structure according to claim 1, wherein electrical contact between the ends of the plurality of conductive films and the second plurality of terminals is maintained by an adhesive force of a portion in which the top surface of the base resin is bonded to the substrate.

3. The electronic component mounting structure according to claim 1, wherein a protruding line portion is formed on at least a part of the base resin, a cross section of the protruding line portion having a shape of one of a rough semicircle, a rough semi-ellipse, and a rough trapezoid, and the plurality of conductive films are provided in a form of stripes on the connecting portion of the base resin along the direction perpendicular to the first and second openings.

4. The electronic component mounting structure according to claim 1, wherein the electronic component is a semiconductor element.

5. The electronic component mounting structure according to claim 1, wherein the base resin has a third opening that exposes the active face, and each of the plurality of conductive films extends from the first opening, passes over the base resin, and reaches the third opening.

6. An electronic apparatus, comprising:
a substrate including a terminal;
an electronic component having an active face thereon;
an electrode that is formed on the active face of the electronic component;
a base resin that is formed on the active face;
a first opening that is formed at the base resin to expose the electrode; and
a conductive film that covers a first part of a top surface of the base resin and that is electrically connected to the electrode via the first opening, wherein
sides of the first opening are surrounded by the base resin,
a second part of the top surface of the base resin is bonded to the substrate, and
the conductive film of the electronic component located on the first part of the top surface of the base resin is coupled to the terminal of the substrate.

7. The electronic apparatus according to claim 6, wherein the base resin has a second opening that exposes the active face, and the conductive film extends from the first opening, passes over the first part of the top surface of the base resin, and reaches the second opening.

8. The electronic apparatus according to claim 6, wherein electrical contact between the conductive film and the terminal is maintained by an adhesive force of the base resin to the substrate.

9. The electronic apparatus according to claim 6, wherein the electronic component is a semiconductor element.

\* \* \* \* \*